(12) United States Patent
Takahashi

(10) Patent No.: US 9,950,512 B2
(45) Date of Patent: Apr. 24, 2018

(54) LIQUID DISCHARGE HEAD

(71) Applicant: CANON KABUSHIKI KAISHA, Tokyo (JP)

(72) Inventor: Tomohiro Takahashi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 41 days.

(21) Appl. No.: 15/346,390

(22) Filed: Nov. 8, 2016

(65) Prior Publication Data
US 2017/0142826 A1    May 18, 2017

(30) Foreign Application Priority Data

Nov. 12, 2015   (JP) ................... 2015-221851

(51) Int. Cl.
| | |
|---|---|
| B41J 2/175 | (2006.01) |
| B41J 2/01 | (2006.01) |
| B41J 2/14 | (2006.01) |
| H05K 1/11 | (2006.01) |
| H05K 3/10 | (2006.01) |

(52) U.S. Cl.
CPC .............. B41J 2/01 (2013.01); B41J 2/1433 (2013.01); B41J 2/1753 (2013.01); B41J 2/17553 (2013.01); H05K 1/111 (2013.01); H05K 3/10 (2013.01); B41J 2002/14491 (2013.01); H05K 2201/20 (2013.01)

(58) Field of Classification Search
CPC .. B41J 2/01; B41J 2/1433; B41J 2002/14491; B41J 2/17553; B41J 2/1753; H05K 1/111; H05K 3/10; H05K 2201/20
See application file for complete search history.

(56) References Cited

U.S. PATENT DOCUMENTS

2004/0150088 A1* 8/2004 Corisis .................... H01L 23/13
                                                            257/684
2014/0225957 A1* 8/2014 Takahashi ................. B41J 2/01
                                                            347/20

FOREIGN PATENT DOCUMENTS

JP          2010186769 A    8/2010

* cited by examiner

*Primary Examiner* — Manish S Shah
*Assistant Examiner* — Yaovi M Ameh
(74) *Attorney, Agent, or Firm* — Canon U.S.A., Inc. IP Division

(57) ABSTRACT

A liquid discharge head includes an element substrate to which an electric signal is supplied, an electrical wiring board that is connected to the element substrate and that is capable of supplying the electric signal to the element substrate, and a printed circuit board that includes a wiring line and an insulating layer covering the wiring line and that is capable of supplying the electric signal to the element substrate via the wiring line. A protruding structure that has a thickness approximately equal to a thickness of the wiring line and that is covered with the insulating layer is disposed along the wiring line on the printed circuit board, and a portion of the electrical wiring board is bonded to a portion of the insulating layer located on the wiring line disposed on the printed circuit board.

12 Claims, 11 Drawing Sheets

LIQUID DISCHARGE HEAD

BACKGROUND OF THE INVENTION

Field of the Invention

The disclosure relates to a liquid discharge head that includes a printed circuit board.

Description of the Related Art

Wire bonding is known as a method of connecting a pad of a printed circuit board and a pad of an electrical wiring board to each other. In wire bonding, an electrical wiring board is bonded to a portion of a printed circuit board located in the vicinity of a pad on the printed circuit board, after which the pad of the printed circuit board and a pad of the electrical wiring board are connected to each other with a bonding wire. In order to perform wire bonding, each of the pads needs to be positioned as horizontally as possible. Consequently, it is desirable that the electrical wiring board be bonded to a flat portion of the printed circuit board.

In the manufacture of a printed circuit board, the printed circuit board is entirely covered with a resist from above wiring lines of the printed circuit board, and an inclination of a surface layer of the resist derived from the irregularities of the wiring lines may sometimes occur due to the thicknesses of the wiring lines, the widths of the wiring lines, the pitch of the wiring lines, and the thickness of the resist covering the wiring lines. In a method disclosed in Japanese Patent Laid-Open No. 2010-186769, irregularities and an inclination of a surface layer of a resist due to wiring lines is suppressed by performing several times a process of forming an insulating layer (resist) after an electrically conductive layer has been formed.

However, in the case of providing a plurality of resist layers as described in Japanese Patent Laid-Open No. 2010-186769, the number of resist-layer application steps and the number of resist-layer removing steps increase, which in turn results in a decrease in manufacturing efficiency.

SUMMARY OF THE INVENTION

Accordingly, the disclosure is directed at providing a liquid discharge head in which the inclination of a bonding pad of an electrical wiring board bonded to a printed circuit board can be suppressed without increasing the number of steps of applying a resist layer.

A liquid discharge head according to an aspect of the disclosure includes an element substrate to which an electric signal is supplied, an electrical wiring board that is connected to the element substrate and that is capable of supplying the electric signal to the element substrate, and a printed circuit board that is partially superposed with the electrical wiring board and that is capable of supplying the electric signal to the electrical wiring board via a wiring line covered with an insulating layer. A protruding structure that has a thickness approximately equal to a thickness of the wiring is disposed along the wiring line on the printed circuit board.

Further features and aspects of the disclosure will become apparent from the following description of numerous example embodiments with reference to the attached drawings.

DESCRIPTION OF THE EMBODIMENTS

First Example Embodiment

A first example embodiment of the disclosure will be described below with reference to the drawings.

Figure 1:
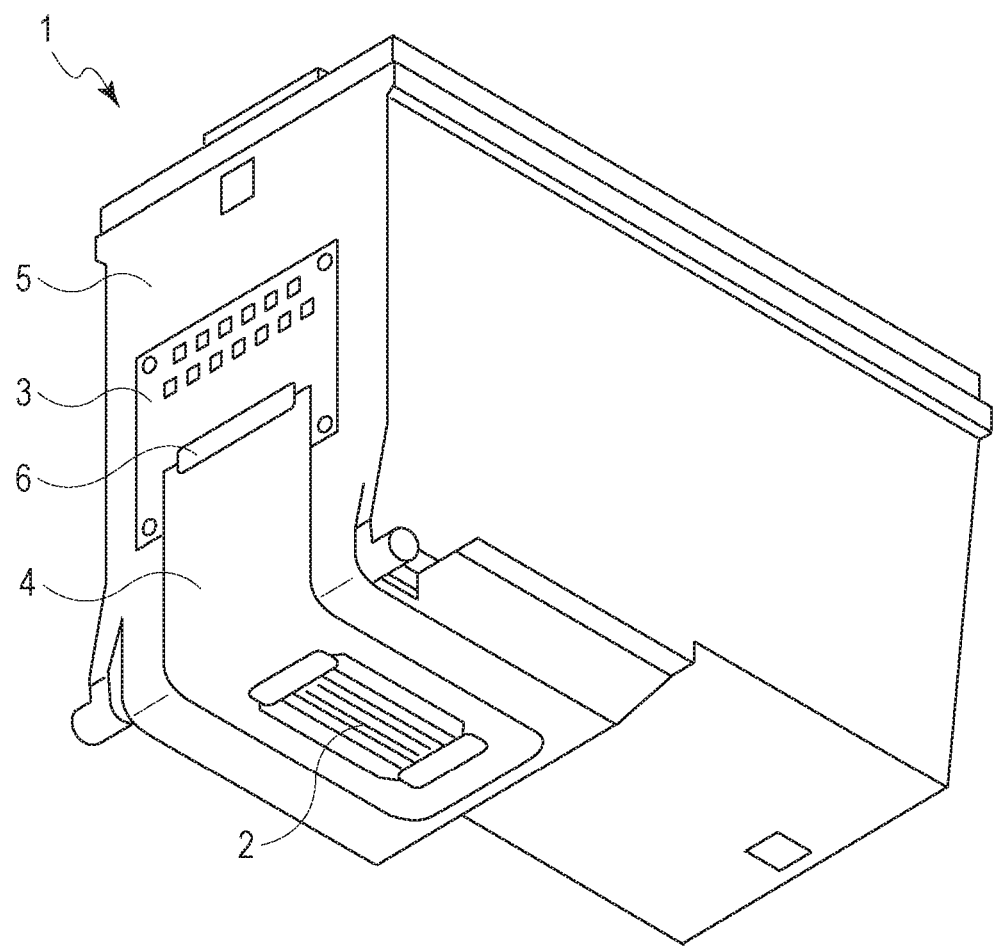
FIG. 1 is a perspective view of an example liquid discharge head.

FIG. 1 is a perspective view of a liquid discharge head 1 to which the first embodiment can be applied. The liquid discharge head 1 includes a liquid discharge substrate (element substrate) 2 that discharges a liquid, an electrical wiring board 4, a printed circuit board 3, and a housing 5. In the electrical wiring board 4 that is capable of transmitting an electric signal, an electric signal path (that is capable of supplying an electric signal) is formed, and the electric signal path applies an electric signal for discharging a liquid to the liquid discharge substrate 2. An electrical-terminal connecting portion 6 is formed at an end of the electrical wiring board 4, and the electrical-terminal connecting portion 6 is used for electrically connect the electrical wiring board 4 and the printed circuit board 3, which includes an external-signal input terminal for receiving an electric signal, to each other. The electrical wiring board 4 and the printed circuit board 3 are partially superposed with each other at the connecting portion, and the electrical-terminal connecting portion 6 of the electrical wiring board 4 and the printed circuit board 3 are electrically connected to each other by wire bonding.

Figure 2A:
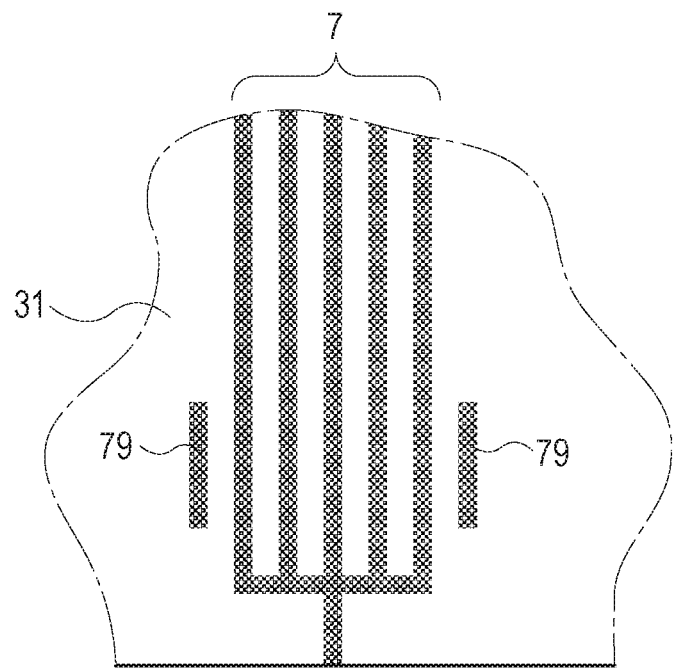
FIGS. 2A and 2B are diagrams each illustrating part of an example process of manufacturing a printed circuit board.
Figure 2B:
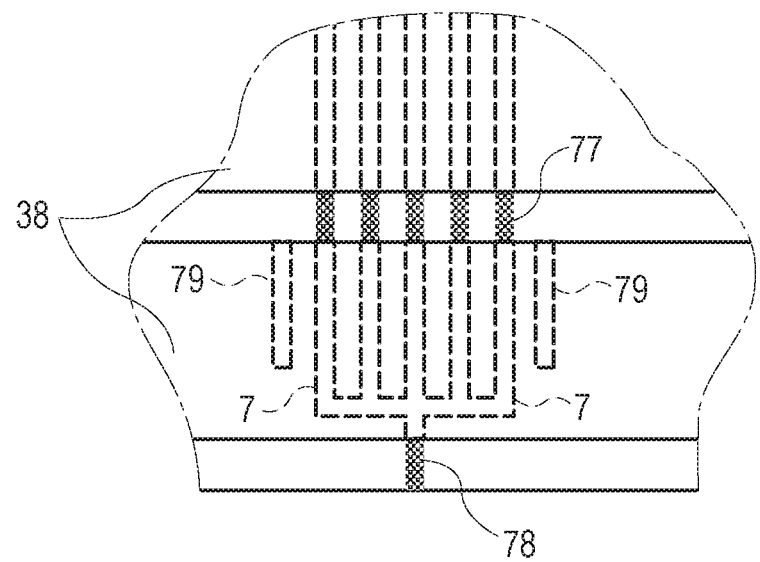

FIGS. 2A and 2B are diagrams each illustrating part of a process of manufacturing the printed circuit board 3. FIG. 2A is a diagram illustrating a state before a resist is applied, and FIG. 2B is a diagram illustrating a state after the resist has been applied. A method for manufacturing the printed circuit board 3 will be described below. First, a glass epoxy or the like is used as the material of a substrate 31. A copper foil is often used for forming a wiring pattern 7, and in general, the thickness of the wiring pattern 7 is about 10 to 100 µm. In the first embodiment, a glass epoxy is used as the material of the substrate 31, and a copper foil having a thickness of 25 µm is used for forming the wiring pattern 7. The width of each wiring line of the wiring pattern 7 is set to 70 µm. In the first embodiment, as illustrated in FIG. 2A, protruding structures 79 are formed on both sides of an array of wiring lines of the wiring pattern 7 in a direction in which the wiring lines are arranged. Note that, in the manufacture of the structures 79, in order to simplify the manufacturing process, the protruding structures 79 each having a width equal to that of each of the wiring lines of the wiring pattern 7 are formed by using a copper foil having a thickness of 25 µm in the same process of forming the wiring pattern 7. Then, a resist 38 that serves as an insulating layer is applied onto the substrate 31, on which the wiring pattern 7 and the protruding structures 79 have been formed. In this case, as illustrated in FIG. 2B, portions of the resist 38 that are located above portions of the wiring pattern 7, the portions corresponding to bonding pads 77 used for connecting the substrate 31 to the electrical wiring board 4 (different member), and above a portion of the wiring pattern 7, the portion corresponding to a terminal 78 used for performing application of a current in a plating process (described later), are removed by patterning. A material having low electrical conductivity, such as a polyamide resin or a thermosetting epoxy resin, is often used as the resist 38, and such a liquid material is often cured by being heated or the like after being applied to the substrate 31. In addition, since the resist 38 needs to have a thickness large enough to suppress corrosion of the wiring lines and to maintain insulation between the wiring lines in the conceivable environments in which the resist 38 is used, the thickness of the resist 38 is often set to about 10 to 100 µm. In the first embodiment, a thermosetting epoxy resin in a liquid state is used as the material of the resist 38, and the thermosetting epoxy resin is cured by being heated after being applied to the substrate 31 in such a manner that the resist 38 has a thickness of 30 µm. Next, the portions of the wiring pattern 7 corresponding to the bonding pads 77 are immersed in a plating solution, and a current is applied to the bonding pads 77 via the terminal 78, so that electrolytic plating is performed on the bonding pads 77. The electrolytic plating is performed in order to suppress corrosion of the portions of the wiring pattern 7 that are exposed to the outside through the resist 38 (i.e., the bonding pads 77) and to improve the bonding property of each of the bonding pads 77. In the first embodiment, gold is used as a plating material. Although plating is performed only on the portions of the wiring pattern 7 corresponding to the bonding pads 77 in the first embodiment, plating may also be performed on the entirety or a different portion of the wiring pattern 7.

Figure 3A:
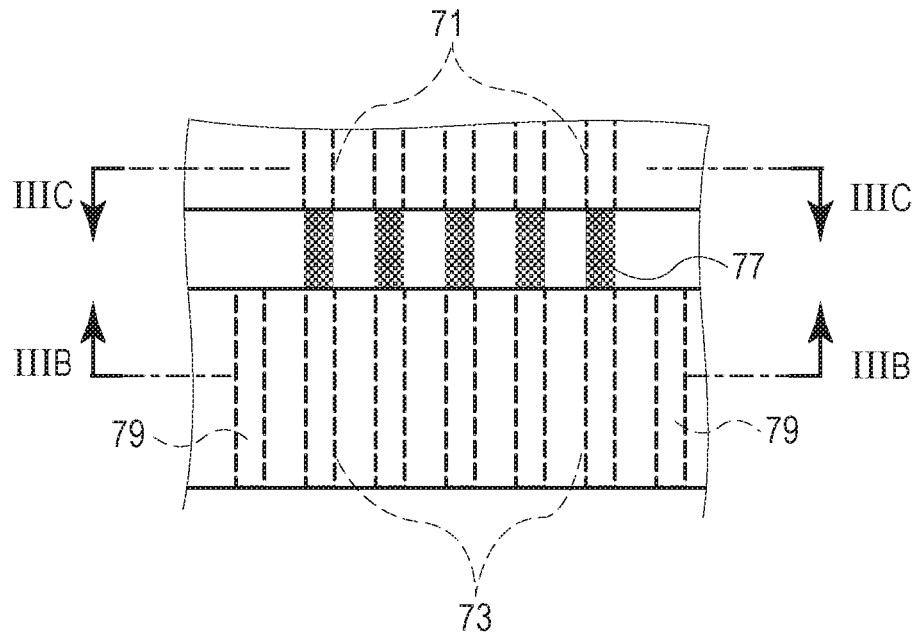
FIGS. 3A to 3C are a schematic diagram and schematic cross-sectional views each illustrating an example portion of the printed circuit board.
Figure 3B:
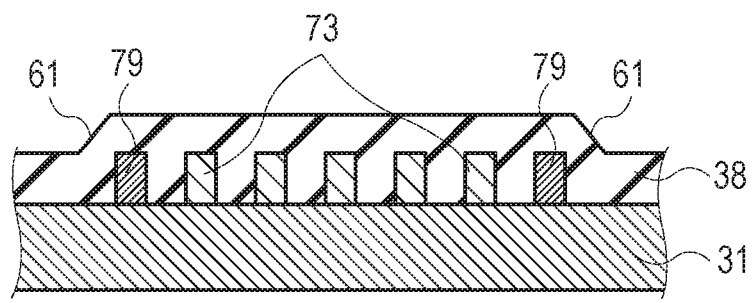
Figure 3C:
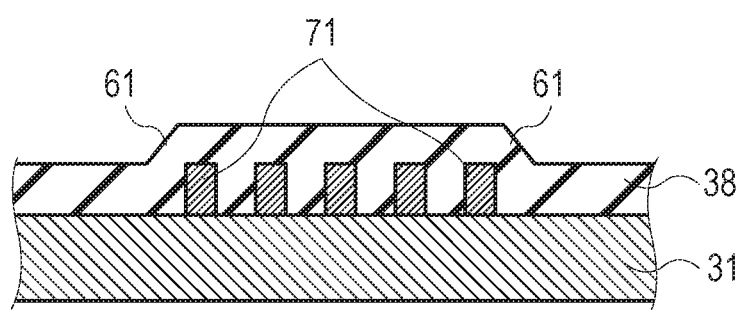

FIGS. 3A to 3C are a schematic diagram and schematic cross-sectional views each illustrating a portion of the printed circuit board 3. By cutting the substrate 31 as illustrated in FIG. 3A after electrolytic plating has been performed on the bonding pads 77, the wiring lines of the wiring pattern 7 are disconnected from one another, and as a result, the printed circuit board 3 is completed. The wiring pattern 7 of the completed printed circuit board 3 is separated into wiring lines 71 that are used when the liquid discharge head 1 is used and wiring lines (hereinafter also referred to as plated wiring lines) 73 that are used for application of a current performed in an electrolytic plating process with the bonding pads 77 interposed between the wiring lines 71 and the plated wiring lines 73. In other words, the wiring pattern 7 extends to end portions of the substrate 31 in the state illustrated in FIG. 3A. In the first embodiment, each of the protruding structures 79 has a length approximately equal to the length of each of the plated wiring lines 73 extending in a direction crossing in a direction in which the plated wiring lines 73 are arranged.

FIG. 3B is a cross-sectional view taken along line IIIB-IIIB of FIG. 3A. Regarding a surface of the resist 38 covering the plated wiring lines 73, portions of the surface that are located above the plated wiring lines 73 and above inner portions of the structures 79, the inner portions being located on the side on which the array of the plated wiring lines 73 is disposed, are formed flat. In addition, there is a difference in level between the above-mentioned flat portions of the surface of the resist 38 and other portions of the surface of the resist 38, the other portions being located above outer portions of the structures 79, the outer portions being located on the side opposite to the side on which the array of the plated wiring lines 73 is disposed, and inclined surface portions 61 that are inclined upward toward the array of the plated wiring lines 73 and are formed in such a manner as to connect the portions of the surface of the resist 38, which are positioned at different levels. The height of each of the inclined surface portions 61 is set to about 20 µm. FIG. 3C is a cross-sectional view taken along line IIIC-IIIC of FIG. 3A. The structures 79 are not provided on both sides of the wiring lines 71, which are used when the liquid discharge head 1 is used. Thus, a portion of the top surface of the resist 38 covering the wiring lines 71, the portion being located above the wiring lines 71 excluding the outermost wiring lines 71 is formed flat. However, there is a difference in level between the above-mentioned flat port ion of the top surface of the resist 38 and other portions of the top surface of the resist 38, the other portions being located above the outermost wiring lines 71, and other inclined surface port ions 61 that are inclined upward toward the array of the wiring lines 71 are formed in such a manner as to connect the portions of the top surface of the resist 38, which are positioned at different levels. As described above, in the case where the inclined surface portions 61 are formed above the wiring lines 71, when the electrical wiring board 4 is bonded to the inclined surface portions 61, it is difficult to maintain the electrical wiring board 4, which has been bonded to the inclined surface portions 61, in a horizontal position.

In the first embodiment, the protruding structures 79 are disposed on both sides of the array of the plated wiring lines 73, and by bonding the electrical wiring board 4 above the region in which the array of the plated wiring lines 73 are disposed, a flat surface is formed without forming an inclined surface above the plated wiring lines 73. As a result, the electrical wiring board 4, which has been bonded, can easily be maintained in a horizontal position above the wiring lines 73. Portions of or the entire protruding structures 79 may be removed after a resist layer has been formed.

The configuration of the liquid discharge head 1 and a method for manufacturing the liquid discharge head 1 using the printed circuit board 3 that is fabricated by the above-described method will now be described.

Figure 4A:
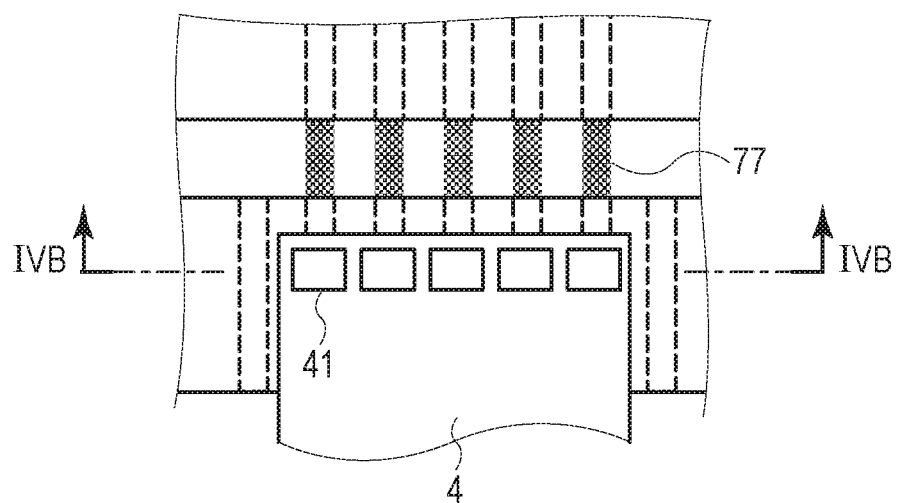
FIGS. 4A and 4B are respectively a schematic diagram and a cross-sectional view each illustrating a state in which an electrical wiring board has been bonded to the printed circuit board 3.
Figure 4B:
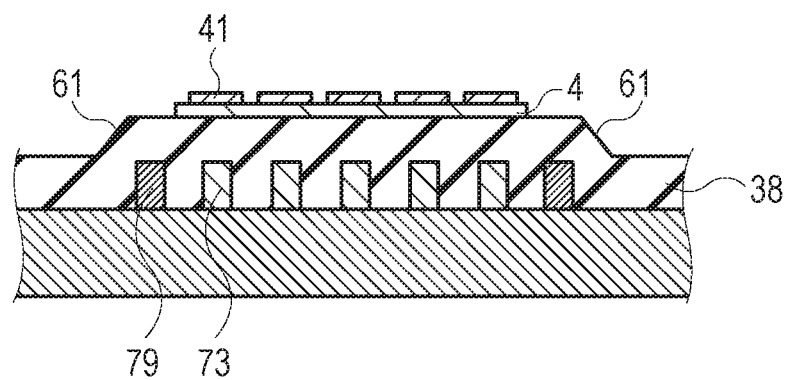

FIG. 4A is a schematic diagram illustrating a state in which the electrical wiring board 4 has been bonded to the printed circuit board 3, and FIG. 4B is a cross-sectional view taken along line IVB-IVB of FIG. 4A. The electrical wiring board 4 is bonded above the plated wiring lines 73 of the printed circuit board 3 by using a thermosetting adhesive. An FPC, a TAB, or the like is used as the electrical wiring board 4. In the first embodiment, an FPC that includes bonding pads 41, the number of the bonding pads 41 being equal to that of the bonding pads 77 of the printed circuit board 3, is used as the electrical wiring board 4. The electrical wiring board 4 is accurately bonded in such a manner that the bonding pads 41 of the electrical wiring board 4 face the bonding pads 77 of the printed circuit board 3. In this case, there are flat surfaces between the inclined surface portions 61 of the resist 38 that are located above the protruding structures 79 and the outermost bonding pads 41 among the bonding pads 41, and the electrical wiring board 4 is bonded to the flat surfaces. Thus, on the rear surface of the electrical wiring board. 4, the rear surface being opposite to a surface of the electrical wiring board 4 that is bonded to the printed circuit board 3, all the bonding pads 41 on the electrical wiring board 4 including the outermost bonding pads 41 are maintained in a substantially horizontal position without being inclined.

After the printed circuit board 3 and the electrical wiring board 4 have been bonded together, each of the bonding pads 77 of the printed circuit board 3 and a corresponding one of the bonding pads 41 of the electric wiring board 4 are electrically connected to each other by wire bonding. Since the outermost bonding pads 41 are not inclined, favorable wire bonding may be performed with an appropriate load. Then, the electrical wiring board 4 is electrically connected to a semiconductor chip that includes discharge ports and discharge-pressure generating elements, and as a result, the liquid discharge head 1 is formed.

Figure 5A:
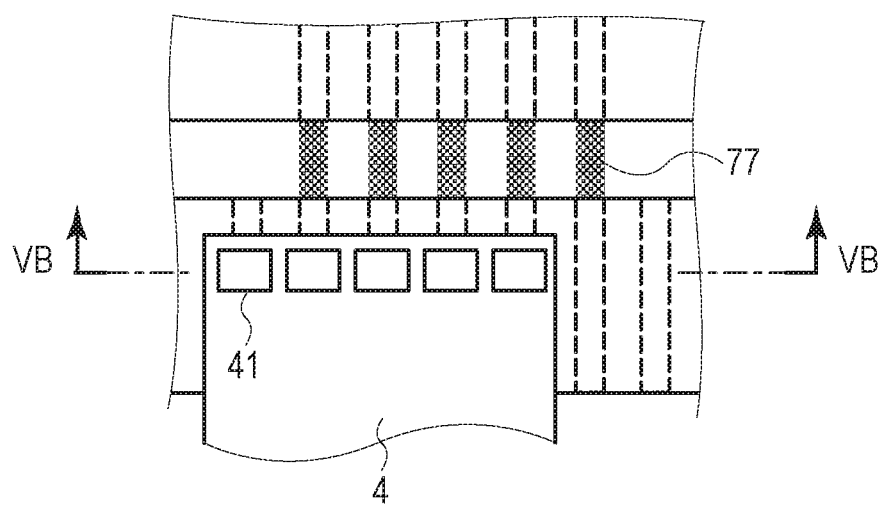
FIGS. 5A and 5B are respectively a schematic diagram and a cross-sectional view each illustrating a state in which the electrical wiring board is bonded to the printed circuit board while being displaced from its proper position.
Figure 5B:
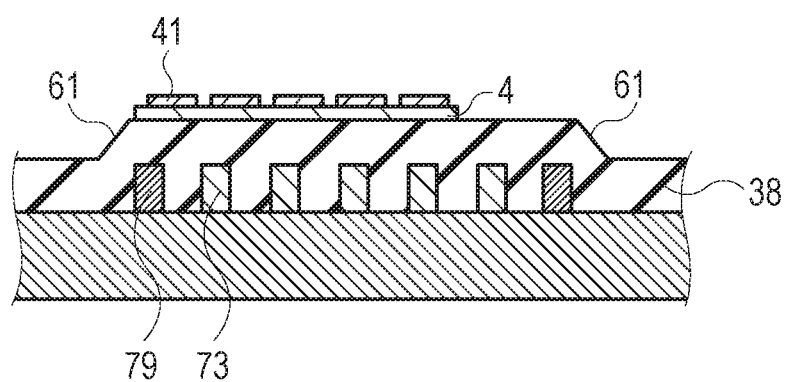

FIG. 5A is a schematic diagram illustrating a state in which the electrical wiring board 4 is bonded to the printed circuit board 3 while being displaced from its proper position, and FIG. 5B is a cross-sectional view taken along line VB-VB of FIG. 5A. Although a case has been described above in which the electrical wiring board 4 is bonded to the printed circuit board 3 with high positional accuracy, if positioning of the electrical wiring board 4 is simplified in order to reduce the time taken for bonding the electrical wiring board 4 to the printed circuit board 3, bonding positional accuracy when bonding the electrical wiring board 4 to the printed circuit board 3 may sometimes deteriorate. A state where the position at which the electrical wiring board 4 is bonded (hereinafter referred to as bonding position of the electrical wiring board 4) is displaced by a distance approximately equal to the width of one of the bonding pads 41 will be described below with reference to FIGS. 5A and 5B.

As a result of disposing the protruding structures 79 on both sides of the array of the wiring lines 73, even if the bonding position of the electrical wiring board 4 is displaced by a distance equal to the width of one of the bonding pads 41 as illustrated in FIG. 5A, the bonding pads 41 of the electrical wiring board 4 can be prevented from being superposed with the inclined surface portions 61. Thus, when the printed circuit board 3 and the electrical wiring board 4 are bonded together, the probability of the bonding pads 41 being inclined can be reduced as illustrated in FIG. 5B. As described above, according to the first embodiment, the probability of the bonding pads 41 being inclined can be reduced even in the case where positioning of the electrical wiring board 4 is simplified, and favorable bonding can be performed.

In the first embodiment, although one protruding structure 79 having a width equal to that of each of the wiring lines of the wiring pattern 7, is disposed on both sides of the wiring pattern 7, the shape of each of the protruding structures 79 and the number of the protruding structures 79 are not limited to those mentioned above. In other words, the shape of each of the protruding structures 79 and the number of the protruding structures 79 are arbitrary as long as, when assuming the bonding positional accuracy when bonding the electrical wiring board 4 to the printed circuit board 3, the outermost bonding pads 41 will not be positioned on the inclined surface portions 61 of the resist 38 even in the case where the bonding position of the electrical wiring board 4 is displaced by a maximum distance. That is to say, the positions of the inclined surface portions 61 of the resist 38 may be controlled while considering the shape of each of the protruding structures 79 and the number of the protruding structures 79.

Figure 6A:
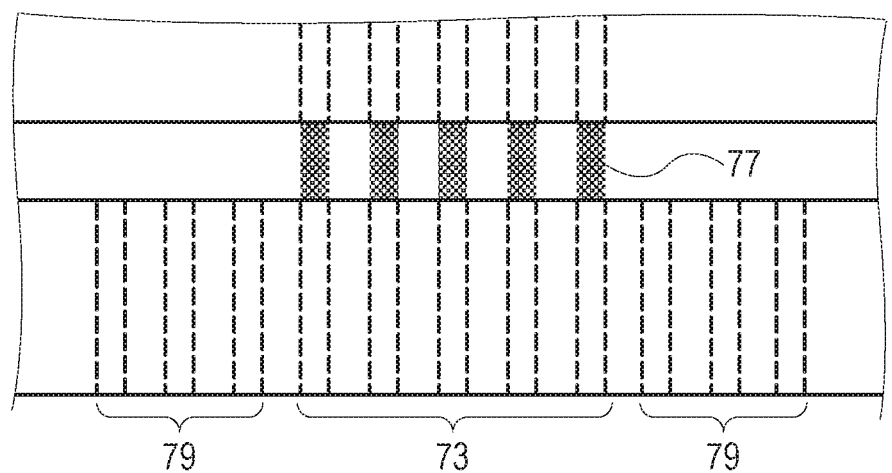
FIGS. 6A and 6B are respectively a schematic diagram and a cross-sectional view each illustrating an example printed circuit board on which protruding structures are disposed.
Figure 6B:
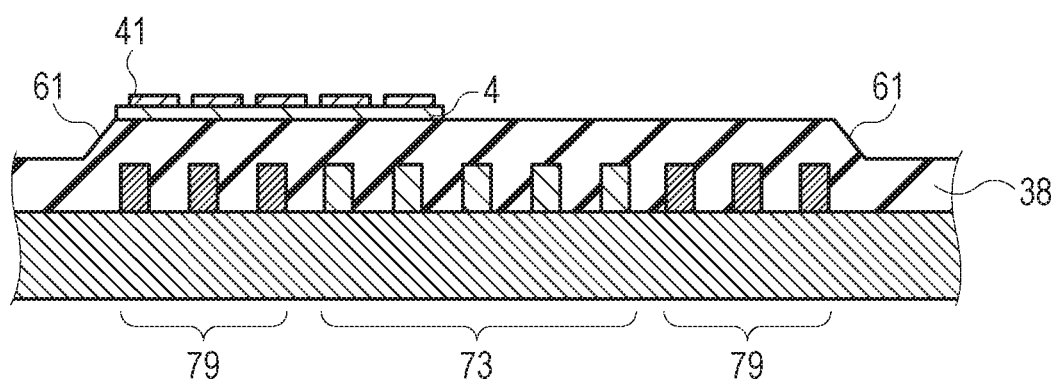

FIGS. 6A and 6B are respectively a schematic diagram illustrating a printed circuit board on which a plurality of protruding structures are disposed and a cross-sectional view of the printed circuit board. For example, when it is assumed that the bonding position of the electrical wiring board 4 is displaced by a maximum distance equal to the total width of three bonding pads 41, three protruding structures 79, each of which has a width approximately equal to that of each of the plated wiring lines 73, may be disposed on both sides of the plated wiring lines 73 in such a manner as to be arranged at a pitch similar to that of the plated wiring lines 73. By arranging the structures 79 in this manner, the outermost bonding pads 41 will not be positioned on the inclined surface portions 61 of the resist 38 even if the bonding position of the electrical wiring board 4 is displaced by a distance equal to the total width of three bonding pads 41, and the probability of the outermost bonding pads 41 being inclined is reduced.

Figure 7:
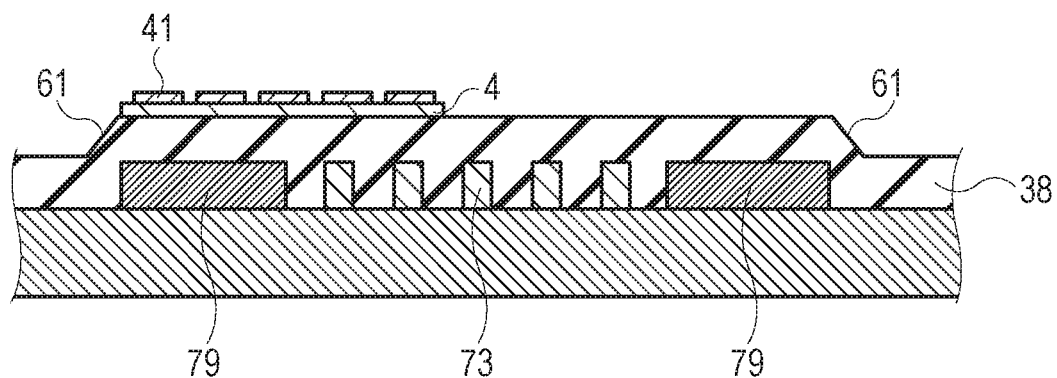
FIG. 7 is a cross-sectional view illustrating an example printed circuit board, on which the protruding structures each having a large width are disposed, and the electrical wiring board 4.

FIG. 7 is a schematic cross-sectional view illustrating a state where the electrical wiring board 4 is bonded to a printed circuit board on which the protruding structures 79 each having a large width are disposed. It is not necessary for each of the protruding structures 79 to have a width approximately equal to the width of each of the plated wiring lines 73, and the number of the protruding structures 79 may be reduced by increasing the width of the protruding structures 79 so as to be larger than that of each of the plated wiring lines 73.

Figure 8:
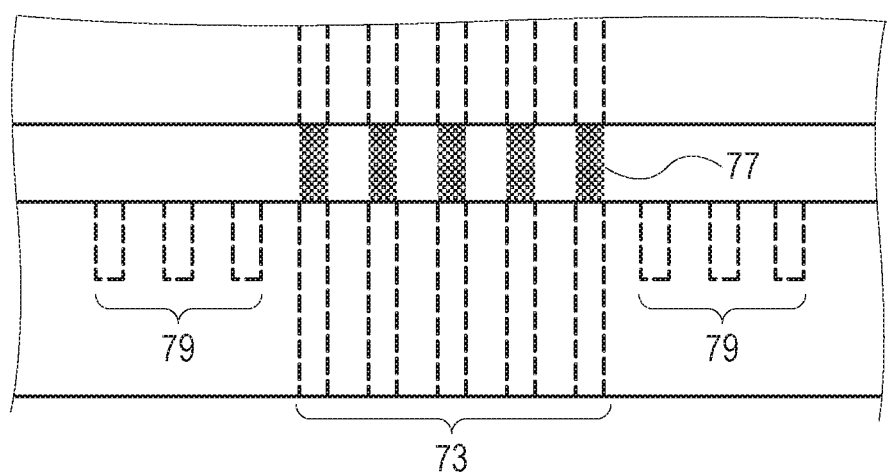
FIG. 8 is a schematic diagram illustrating an example printed circuit board on which the protruding structures each having a small length are disposed.

FIG. 8 is a schematic diagram illustrating a printed circuit board on which the protruding structures 79 each having a small length are disposed. The length of each of the protruding structures 79 in a direction crossing the direction in which the wiring lines of the wiring pattern 7 are arranged may be set to be smaller than that of each of the plated wiring lines 73 as long as the bonding pads 41 of the electrical wiring board 4 are not positioned on the inclined surface portions 61 of the resist 38.

Figure 9:
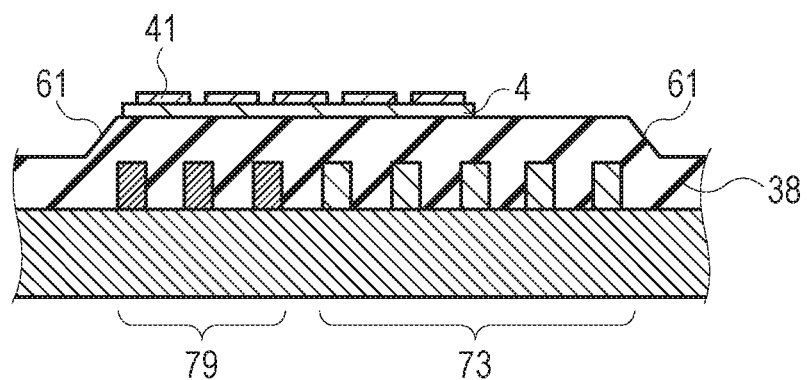
FIG. 9 is a schematic diagram illustrating an example printed circuit board on which the protruding structures are disposed only on one side of the printed circuit board.

FIG. 9 is a schematic diagram illustrating a printed circuit board on which the protruding structures 79 are disposed only on one side of the printed circuit board. Although a configuration has been described above in which the protruding structures 79 are disposed on both sides of the array of the wiring lines of the wiring pattern 7, the protruding structures 79 may be disposed on only one side of the array of the wiring lines of the wiring pattern 7 as illustrated in FIG. 9. In this case, by bonding the electrical wiring board 4 to a position near the protruding structures 79, the bonding pads 41 can be prevented from being positioned on the inclined surface portions 61 of the resist 38.

Figure 10:
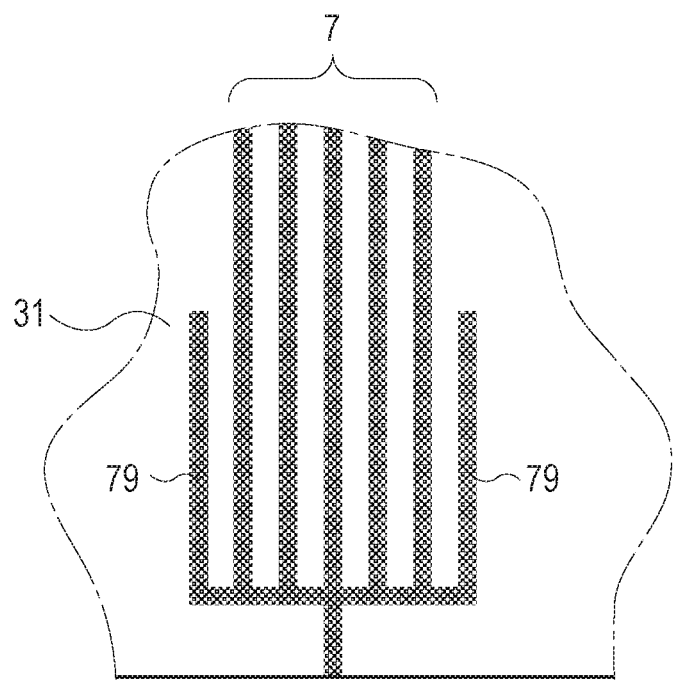
FIG. 10 is a schematic diagram illustrating an example substrate including structures that are disposed as dummy wiring lines.

FIG. 10 is a schematic diagram illustrating the substrate 31 including the protruding structures 79 that are disposed as dummy wiring lines and connected to the wiring pattern 7. As illustrated in FIG. 10, each of the protruding structures 79 may be disposed as a dummy wiring line so as to be located outside a corresponding one of the wiring lines, which are the outermost wiring lines positioned on the two sides of the wiring pattern 7, and may be connected to the wiring pattern 7.

Note that, in the first embodiment, although the protruding structures 79 are formed in the same process of forming the wiring pattern 7, the disclosure is not limited to this method of forming the protruding structures 79, and the protruding structures 79 may be provided by, for example, bonding the protruding structures 79 to the substrate 31 while managing the height of each of the protruding structures 79.

In the case where there are large spaces between the wiring lines of the wiring pattern 7 and where irregularities occur in the top surface of the resist 38, which covers the wiring pattern 7, above the spaces between the wiring lines of the wiring pattern 7, the protruding structures 79 may be disposed between the wiring lines of the wiring pattern 7.

As described above, protruding structures, each of which has a thickness approximately equal to that of each of wiring lines of a wiring pattern of a printed circuit board, are arranged along the wiring pattern. Accordingly, a surface of the printed circuit board to which an electrical wiring board is to be bonded can be formed flat. As a result, a printed circuit board in which the inclination of a bonding pad of an electrical wiring board bonded to the printed circuit board can be suppressed without increasing the number of steps of applying a resist layer, a liquid discharge head that includes the printed circuit board, and a method for manufacturing the printed circuit board can be realized.

Second Example Embodiment

A second embodiment of the disclosure will be described below with reference to the drawings. Note that the basic configuration of the second embodiment is similar to that of the first embodiment, and thus, only characteristic configurations of the second embodiment will be described.

Figure 11A:
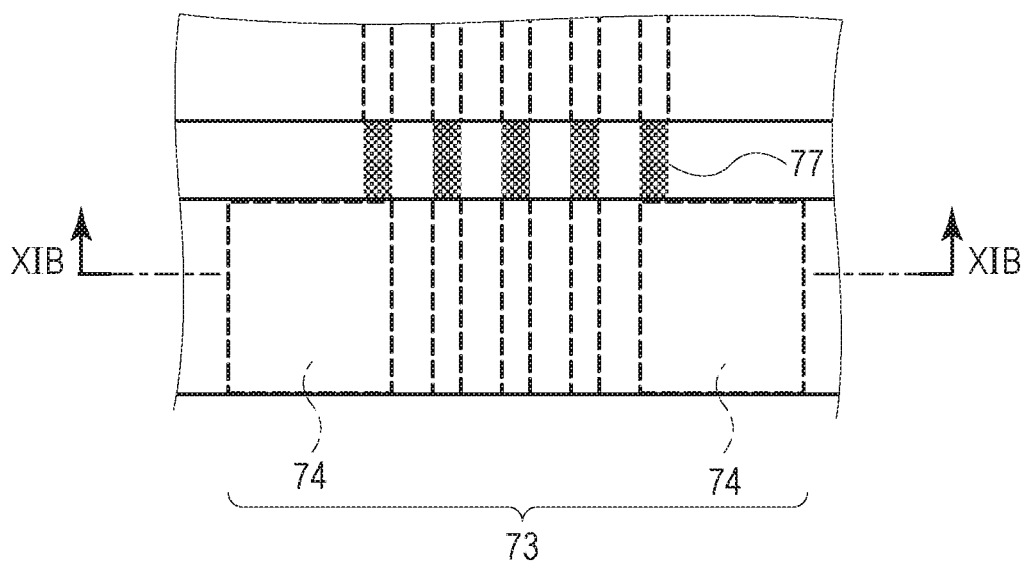
FIGS. 11A and 11B are a schematic diagram and a cross-sectional view illustrating an example printed circuit board.
Figure 11B:
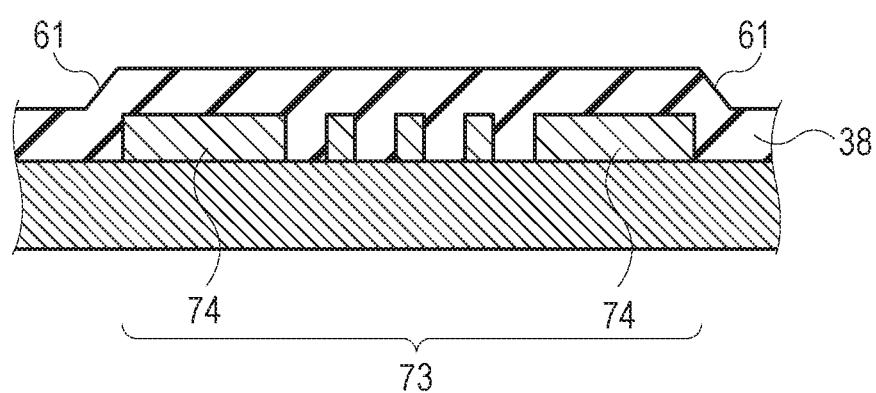

FIG. 11A is a schematic diagram illustrating a printed circuit board according to the second embodiment, and FIG. 11B is a cross-sectional view taken along line XIB-XIB of FIG. 11A. In the second embodiment, the positions of the inclined surface portions 61 of the resist 38 are spaced away from the bonding position of the electrical wiring board 4 by increasing the width of each of the outermost plated wiring lines 73 among the plated wiring lines 73. In other words, in the second embodiment, the protruding structures 79 are formed integrally with the corresponding outermost plated wiring lines 73. As illustrated in FIGS. 11A and 11B, in the second embodiment, the width of each of plated wiring lines 74, which are the outermost plated wiring lines 73 among the plurality of plated wiring lines 73, is set to be larger than that of each of the other plated wiring lines 73. The width of each of the plated wiring lines 74, which are the outermost plated wiring lines 73, may be set while assuming the bonding positional accuracy when bonding of the electrical wiring board 4 is performed. That is to say, the width of each of the plated wiring lines 74, which are the outermost plated wiring lines 73, may be set in such a manner that the bonding pads 41 of the electrical wiring board 4 will not be positioned on the inclined surface portions 61 of the resist 38 even if the bonding position of the electrical wiring board 4 is displaced by a maximum distance.

In the second embodiment, it is assumed that a maximum amount of displacement of the bonding position of the electrical wiring board 4 when bonding of the electrical wiring board 4 is performed is 200 μm, and the width of each of the plated wiring lines 74, which are the outermost plated wiring lines 73, is set to 300 μm whereas the width of each of the other plated wiring lines 73 is 70 μm.

Note that, in the second embodiment, although a protruding structure is not provided on both sides of the array of the plated wiring lines 73, the disclosure is not limited to this configuration, and a structure may be disposed on both sides of the array of the plated wiring lines 73 as necessary.

Figure 12:
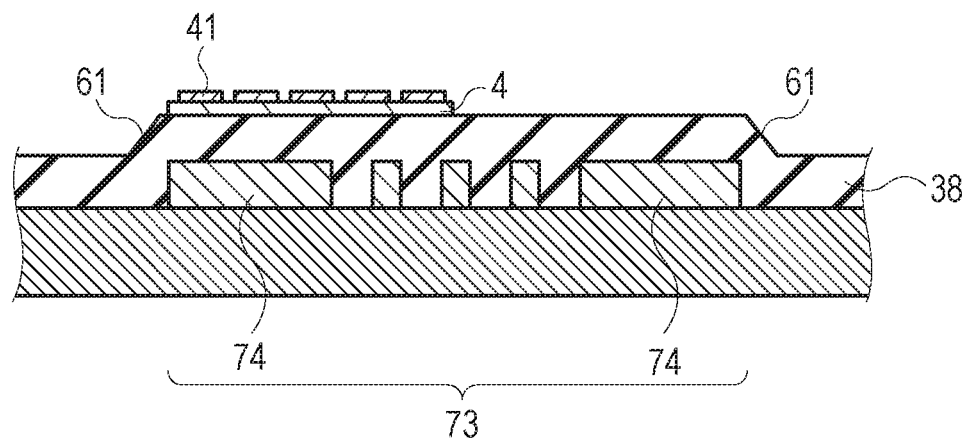
FIG. 12 is a schematic diagram illustrating a state where the electrical wiring board has been bonded to the printed circuit board.

FIG. 12 is a schematic diagram illustrating a state where the electrical wiring board 4 has been bonded to the printed, circuit board according to the second embodiment According to the second embodiment, the positions of the inclined surface portions 61 of the resist 38 are spaced away from the bonding position of the electrical wiring board 4 by increasing the width of each of the plated wiring lines 74, which are the outermost plated wiring lines 73 among the plated wiring lines 73. Consequently, even if the bonding position of the electrical wiring board 4 is displaced as illustrated in FIG. 12, the outermost bonding pads 41 can be prevented from being positioned on the inclined surface portions 61 of the resist 38. As a result, the probability of the bonding pads 41 being inclined can be reduced, and favorable bonding can be performed.

Figure 13:
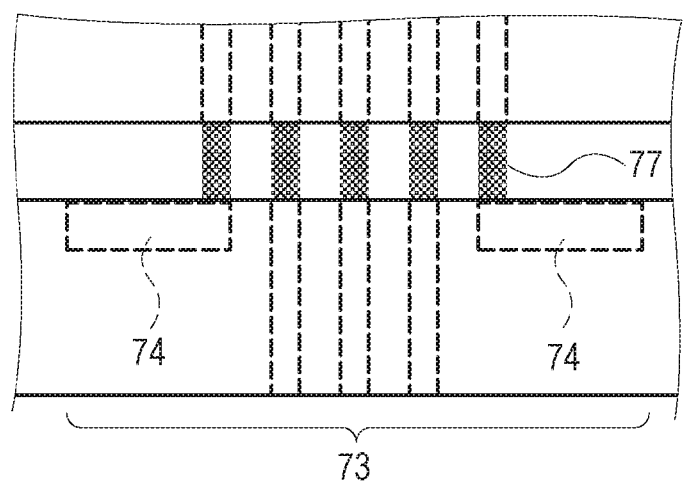
FIG. 13 is a diagram illustrating an example printed circuit board.

FIG. 13 is a diagram illustrating the printed circuit board according to the second embodiment. Each of the plated wiring lines 74, which are the outermost plated wiring lines 73, does not necessarily have a width larger than that of each of the other plated wiring lines 73 across the entire length of the plated wiring lines 74. In other words, as illustrated in FIG. 13, only a portion of each of the plated wiring lines 74, which are the outermost plated wiring lines 73, may be formed so as to have a width larger than that of each of the other plated wiring lines 73 in such a manner that the outermost bonding pads 41 will not be positioned above the inclined surface portions 61 of the resist 38.

In addition, although the configuration in which each of the plated wiring lines 74, which are the outermost plated wiring lines 73, has a large width is illustrated in FIGS. 11A to 12, only one of the plated wiring lines 74 may have a large width.

With the above-described configuration, even in the case where the disclosure is applied to an existing product or the like, the advantageous effects of the disclosure can be obtained by changing only the width of each of the plated wiring lines 74, which are the outermost plated wiring lines 73, without changing the overall layout of the plated wiring lines 73.

Third Example Embodiment

A third embodiment of the disclosure will be described below with reference to the drawings. Note that the basic configuration of the third embodiment is similar to that of the first embodiment, and thus, only characteristic configurations of the third embodiment will be described.

Figure 14:
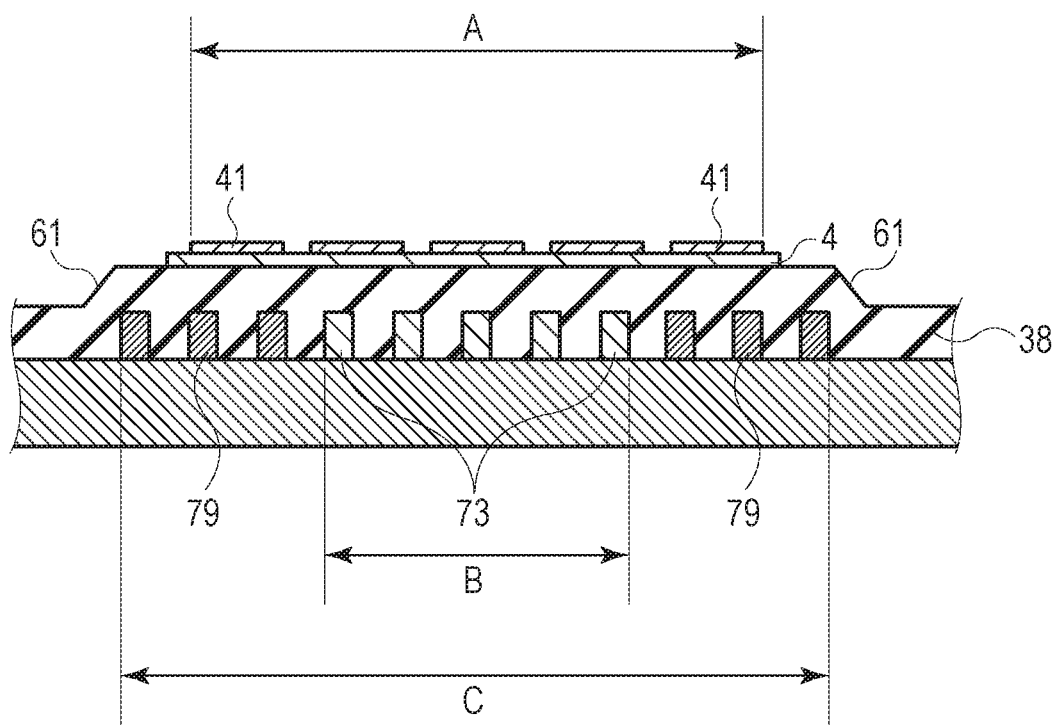
FIG. 14 is a schematic diagram illustrating a state where the electrical wiring board has been bonded to a printed circuit board.

FIG. 14 is a schematic diagram illustrating a state where the electrical wiring board 4 is bonded to a printed circuit board according to the third embodiment. In the third embodiment, a case will be described in which the array width (A) of the bonding pads 41 of the electrical wiring board 4 is larger than the array width (B) of the plated wiring lines 73. In the case where the array width (A) of the bonding pads 41 of the electrical wiring board 4 is larger than the array width (B) of the plated wiring lines 73, the protruding structures 79 are arranged in such a manner that the arrangement distance (C) of the protruding structures 79 on both sides of the array of the plated wiring lines 73 is larger than the array width (A) of the bonding pads 41. Note that, it is only necessary to arrange the protruding structures 79 in such a manner that at least a portion of each of the protruding structures 79 is located outside the corresponding outermost bonding pads 41 of the electrical wiring board 4 in an arrangement width direction when viewed from a direction perpendicular to an interface between the electrical wiring board 4 and the printed circuit board 3.

Note that the arrangement distance (C), the shape of each of the protruding structures 79, and the number of the protruding structures 79 may be set in such a manner that the outermost bonding pads 41 are not positioned above the inclined surface portions 61 of the resist 38 even in the case where the bonding position of the electrical wiring board 4 is displaced by a maximum distance.

Similarly, also in the case where the width of each of the outermost plated wiring lines 73 is set to be large as in the second embodiment, the width of each of the outermost plated wiring lines 73 may be set by taking the array width (A) of the bonding pads 41 of the electrical wiring board. 4 and displacement of the bonding position of the electrical wiring board 4 into consideration.

While the disclosure has been described with reference to numerous example embodiments, it is to be understood that the invention is not limited to the disclosed example embodiments. The scope of the following claims is to be accorded the broadest interpretation so as to encompass all such modifications and equivalent structures and functions.

This application claims the benefit of Japanese Patent Application No. 2015-221851, filed Nov. 12, 2015, which is hereby incorporated by reference herein in its entirety.

What is claimed is:

1. A liquid discharge head comprising:
   an element substrate, having plurality of discharge ports through which a liquid is discharged, to which an electric signal is supplied;
   a flexible printed circuit board connected to the element substrate and configured to supply the electric signal to the element substrate; and
   a printed circuit board, including a wiring line, an insulating layer covering the wiring line, and a base substrate having a surface on which the wiring line is provided, and configured to supply the electric signal to the element substrate via the wiring line,
   wherein the printed circuit board includes a protruding structure,
      the protruding structure having a length in a direction perpendicular to the surface of the base substrate approximately equal to a length of the wiring line in the direction perpendicular to the surface of the base substrate,
      the protruding structure being provided on the surface of the base substrate,
      the protruding structure being covered with the insulating layer, and
      the protruding structure being disposed along the wiring line, and
   wherein a terminal end portion of the flexible printed circuit board is overlapped over the printed circuit board and bonded to a portion of the insulating layer located on the wiring line.

2. The liquid discharge head according to claim 1,
wherein the printed circuit board includes a plurality of the wiring lines that are arranged in an array, and
wherein the protruding structure is disposed on one side of the array of the plurality of the wiring lines along the wiring line among the plurality of the wiring lines, the wiring line being an outermost wiring line positioned on one side of the array of the plurality of the wiring lines.

3. The liquid discharge head according to claim 1,
wherein the protruding structure is made of a material that is a material of the wiring line.

4. The liquid discharge head according to claim 1,
wherein the wiring line includes a pad that is exposed to the outside,
wherein the wiring line extends to an end portion of the printed circuit board, and
wherein, in a direction in which the wiring line extends, the protruding structure has a length approximately equal to a length of the wiring line from the pad to the end portion in the direction in which the wiring line extends.

5. The liquid discharge head according to claim 1,
wherein the wiring line includes a pad that is exposed to the outside,
wherein the wiring line extends to an end portion of the printed circuit board, and
wherein, in a direction in which the wiring line extends, the protruding structure has a length smaller than a length of the wiring line from the pad to the end portion in the direction in which the wiring line extends.

6. The liquid discharge head according to claim 1,
wherein the protruding structure is formed integrally with one of a plurality of the wiring lines that are arranged in an array, the wiring line being an outermost wiring line positioned on one side of the array of the plurality of the wiring lines.

7. The liquid discharge head according to claim 1,
wherein the insulating layer covering the wiring line and the protruding structure forms a flat surface on a portion of the printed circuit board to which the terminal end portion of the flexible printed circuit board is bonded.

8. The liquid discharge head according to claim 1,
wherein a pad that is electrically connected to the printed circuit board is disposed on a rear surface of the terminal end portion of the flexible printed circuit board, the rear surface being opposite to a surface of the terminal end portion of the flexible printed circuit board that is bonded to the printed circuit board.

9. The liquid discharge head according to claim 1,
wherein the wiring line is electrically connected to the flexible printed circuit board and the protruding structure is not electrically connected to the flexible printed circuit board.

10. The liquid discharge head according to claim 2,
wherein a plurality of the protruding structures are each disposed along a corresponding one of the wiring lines among the plurality of the wiring lines, the wiring lines being the outermost wiring lines positioned on two sides of the array the plurality of the wiring lines.

11. The liquid discharge head according to claim 2, wherein, in an arranging direction in which the plurality of the wiring lines are arranged, the protruding structure has a width larger than a width of each of the wiring lines in the arranging direction.

12. The liquid discharge head according to claim 8, wherein, when viewed from a direction perpendicular to the surface of the flexible printed circuit board that is bonded to the printed circuit board, at least a portion of the protruding structure is located outside the pad of the flexible printed circuit board in an arranging direction in which a plurality of the wiring lines are arranged.

* * * * *